(12) United States Patent
Wilhite

(10) Patent No.: US 8,223,048 B2
(45) Date of Patent: Jul. 17, 2012

(54) METHOD AND APPARATUS FOR SELF-TESTING A DIGITAL-TO-ANALOG CONVERTER (DAC) IN AN INTEGRATED CIRCUIT

(75) Inventor: Jeffrey B. Wilhite, Barrington, IL (US)

(73) Assignee: Motorola Solutions, Inc., Schaumburg, IL (US)

( * ) Notice: Subject to any disclaimer, the term of this patent is extended or adjusted under 35 U.S.C. 154(b) by 85 days.

(21) Appl. No.: 12/912,446

(22) Filed: Oct. 26, 2010

(65) Prior Publication Data

US 2012/0098687 A1    Apr. 26, 2012

(51) Int. Cl.
*H03M 1/10* (2006.01)
(52) U.S. Cl. .................................. 341/120; 341/144
(58) Field of Classification Search ............ 341/120, 341/144, 145, 119, 121, 118, 163, 164; 324/76.12, 324/750, 765, 617; 327/276; 714/740, 733, 714/734; 702/123, 117

See application file for complete search history.

(56) References Cited

U.S. PATENT DOCUMENTS

| | | | |
|---|---|---|---|
| 6,320,528 B1 | 11/2001 | Michel | |
| 7,081,841 B1 | 7/2006 | Feist et al. | |
| 7,355,537 B2 | 4/2008 | Lin | |
| 2003/0063019 A1* | 4/2003 | Bulaga et al. | 341/120 |

OTHER PUBLICATIONS

Mohammad S. Nejad et al—"Analog Built-In Self-Test"—Seventh Annual IEEE International ASIC Conference and Exhibit Proceedings—1994—pp. 407-411.

* cited by examiner

*Primary Examiner* — Joseph Lauture
(74) *Attorney, Agent, or Firm* — Barbara R. Doutre

(57) ABSTRACT

An on-chip self testing digital-to-analog converter (DAC) is provided. The functionality of the DAC is measured using a combination of integral non-linearity (INL) and differential non-linearity (DNL). Parts may pass or be rejected based on the testing. When a DAC passes the testing, the process continues to the next DAC or quits if all the DACs have been tested.

21 Claims, 5 Drawing Sheets

US 8,223,048 B2

METHOD AND APPARATUS FOR SELF-TESTING A DIGITAL-TO-ANALOG CONVERTER (DAC) IN AN INTEGRATED CIRCUIT

FIELD OF THE DISCLOSURE

The present disclosure relates generally to electronic integrated circuits and more particularly to a method and apparatus for self testing an integrated circuit having a digital-to-analog converter.

BACKGROUND

Communication products, such as two-way radios, cell phones and the like, utilize a variety of integrated circuits to minimize size, cost and weight. Many of these products, as well as other electronic devices, utilize mixed signal technology wherein both digital and analog functions are processed for multi-mode and multi-band specifications. The efficient operation of a mixed signal device is critical to the overall operation of the end product into which the device is incorporated. A digital-to-analog converter (DAC) is one such circuit that can be integrated either alone or as part of a more complex integrated circuit.

The development, production and testing of mixed signal technology die is time consuming and costly. In addition, final testing of complex integrated circuits incorporating DACs require more test time, which drives up the cost associated with the part. Previous approaches to DAC self-testing have relied on complex test architectures, such as those incorporating an analog-to-digital converter (ADC). While some self-testing capability has been achieved on small DACs (such as a 4 bit or 5 bit DACs), the area required to accomplish this testing becomes prohibitively large as DACs become larger.

Accordingly, there is need for an improved approach for self-testing a DAC in an integrated circuit.

BRIEF DESCRIPTION OF THE FIGURES

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
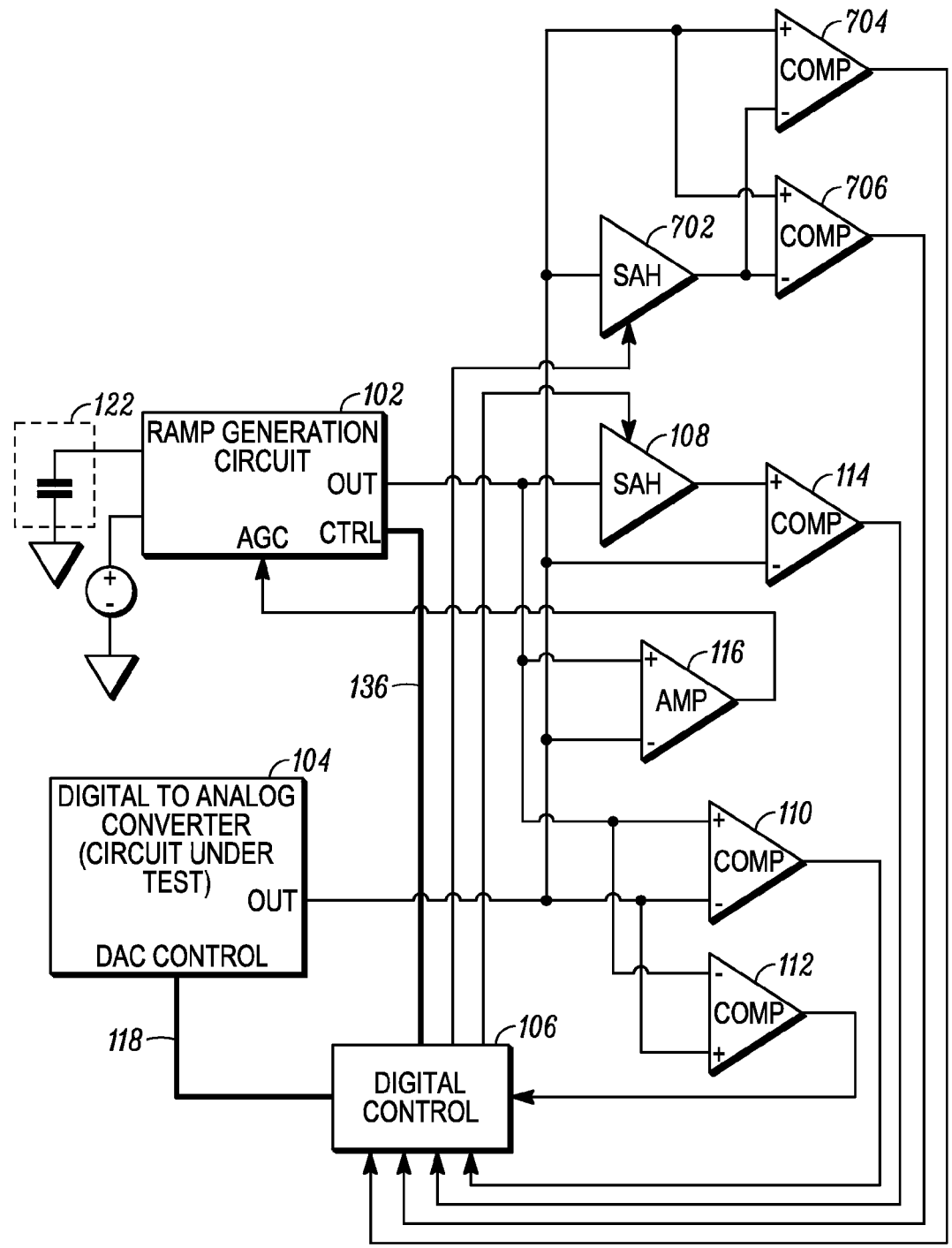
FIG. 1 is a block diagram of a self-testing integrated DAC circuit in accordance with various embodiments of the invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

Briefly, in accordance with various embodiments to be described herein, there is provided a circuit and method for on-chip self testing of digital-to-analog converters (DACs) used in integrated circuits. A combination of a ramp generator in conjunction with a method to train the ramp to detect linearity defects in the DAC thereby improving self-testing capability. The functionality of the DAC is measured using a combination of integral non-linearity (INL) and differential non-linearity (DNL). For the purposes of this application, INL, DNL and monotonicity are defined as follows: INL is a measure of the deviation of the actual transfer response of the DAC from a straight line; DNL is a measure of the variation in the analog step size from one least significant bit (LSB); and monotonicity insures that the output of a DAC either always increases or always decreases as the digital input code increases.

FIG. 1 is a block diagram of an on-chip test circuit for a digital-to-analog converter (DAC) 100 in accordance with various embodiments of the invention. Circuit 100 tests for integral non-linearity and differential non linearity of a DAC 104. An integral non linearity (INL) test circuit 200 is embodied by ramp generation circuit 102, digital control circuit 106, sample and hold circuit 108, comparators 110, 112, 114, and amplifier 116. A differential non linearity (DNL) test circuit 700 is embodied by digital control 106, sample and hold circuit 702 and first and second comparators 704, 706. The INL test circuit 200 will be discussed in conjunction with FIGS. 2, 3, 4 and 5, while the DNL test circuit 700 will be discussed in conjunction with FIG. 7. To facilitate description, two sample and hold circuits 108 and 702 are shown, however a single sample and hold circuit could also be switched back and forth between the two outputs. A method for testing the DAC using is presented in FIG. 8.

Referring initially to FIG. 1, an overall operation of test circuit 100 is provided while more detailed descriptions are provided in the subsequent figures. In operation, ramp generation circuit 102 generates a starting voltage and an ending voltage over time, the ramp generation circuit is trained such that the ramp generation circuit and DAC are swept over time from a same starting time and voltage. Sample and hold circuit 702 captures output samples from the DAC 104, while the other sample and hold circuit 108 captures output samples from the ramp generation circuit 102. The digital control circuit 106 indicates to the DAC 104 whether a predetermined linearity threshold has been exceeded at any instant over the swept time based on the output from the DAC 104 and/or the output from the ramp generation circuit 102. The predetermined linearity threshold comprises INL and DNL thresholds.

The slope of the ramp generated by the ramp generation circuit 102 is trained in two stages, a first stage providing coarse tuning and a second stage providing fine tuning. While further details are provided in conjunction with subsequent figures an overview of the two stages is provided below.

First stage/coarse tuning: The ramp and DAC sweep are started simultaneously and the AGC is enabled for part of the time that the DAC is sweeping and the ramp is ramping. The action of the AGC adjusts the gain such that the slope of the ramp is close to (within a predetermined range of) the slope of the DAC output while the DAC is being swept. Once the AGC has been given sufficient time to adjust (some fraction of the ramp time), the adjusted gain value is held and the AGC action is disabled.

Stage 2/fine tuning: While the AGC has already adjusted the ramp slope in stage 1, some fine adjustment may still be needed. At the instant that the DAC sweep reaches its final value, the SAH 702 samples and holds the ramp output and compares to the DAC final value. The digital control adjusts the ramp gain slightly if necessary and the ramp is run again to confirm that the ramp is properly trained.

Figure 2:
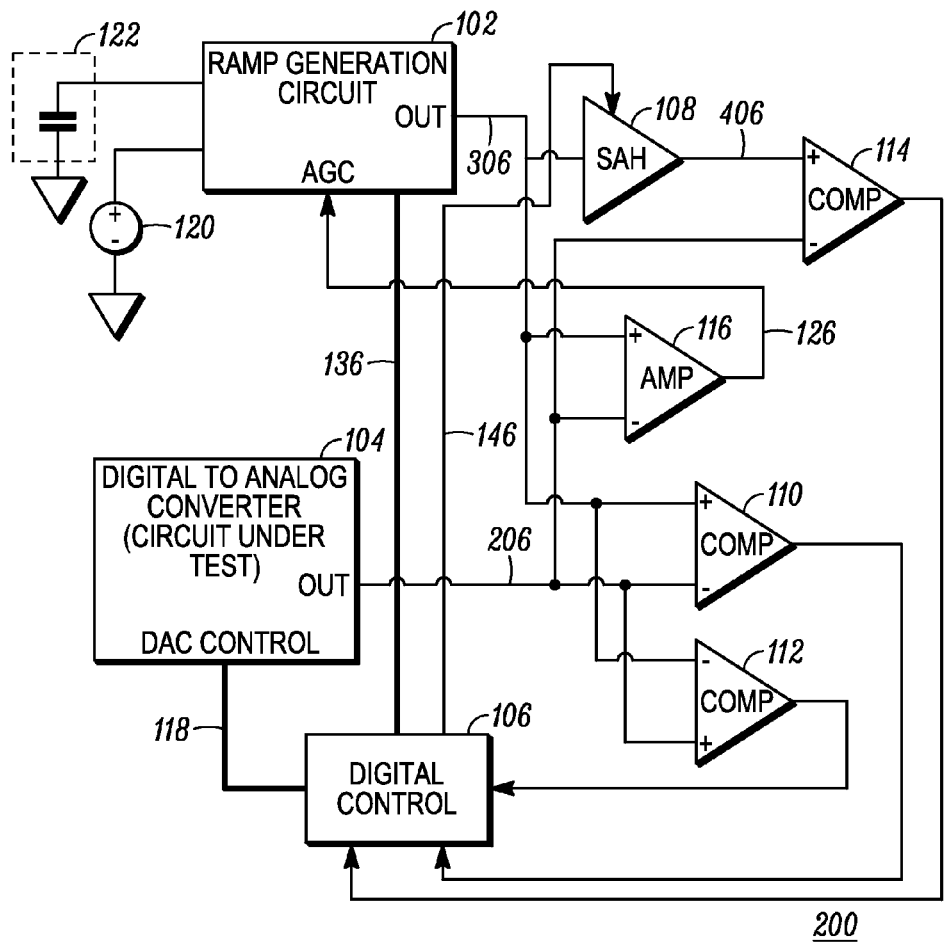
FIG. 2 is a block diagram of an INL portion of the self-testing integrated DAC circuit of FIG. 1 in accordance with various embodiments of the invention.

FIG. 2 is a block diagram of the INL portion 200 of the self-testing integrated DAC circuit 100 in accordance with various embodiments. As mentioned previously, circuit 200 tests for integral non-linearity (INL) of the DAC 104 and comprises ramp generation circuit 102, digital control circuit 106, sample and hold circuit 108, a plurality of comparators 110, 112, 114, and amplifier circuit 116. For the purposes of this application DAC 104 represents a plurality of DACs. An external voltage source 120 and a capacitor 122 are coupled to inputs of the ramp generation circuit 102. Capacitor 122 may integrated on chip or may be an external component depending on the size of the capacitor and available integrated circuit area.

In accordance with this embodiment, the digital control circuit 106 includes a counter that provides programming words 118 to a DAC control input of the DAC 104. In response to the control words 118, the DAC output voltage 206 steps from a minimum output value to a maximum output value in a predetermined manner.

The ramp generation circuit 102 generates an analog ramp 306 in response to ramp control inputs from the digital control circuit 106. The analog ramp 306 is trained such that the starting voltage and slope of the ramp are substantially equivalent to the starting voltage and slope of the DAC output 206. The starting voltage is trained by comparing the starting output of the ramp generation circuit 102 to the starting output of the digital-to-analog converter 104 using first and second comparators 110 and 112. The starting output of the ramp generation circuit 102 is adjusted until it matches that of the digital-to-analog converter 104 as indicated by comparators 110 and 112. Once the digital control circuit 106 initiates the ramping of the output of DAC 104 and ramp generation circuit 102, the slope of ramp 306 is adjusted via an AGC function of the ramp generation circuit 102 and amplifier 116 until the slope 306 is equal to that of DAC output 206. Once the analog ramp 306 is trained, the counter is reset in 106 and ramp generation circuit 102 is reset via control line 136. The counter for the DAC 104 is started at the same time as the analog ramp 102 is started by the digital control circuit 106.

The analog ramp 306 and DAC output 206 are then applied to the inputs of comparators 110 and 112. The comparators are pre-trained to detect a minimum allowable difference in the analog ramp and DAC outputs. The difference corresponds to the INL. If at any time, the comparators detect a voltage difference between the analog ramp 306 and DAC output 206 that exceeds a predetermined deviation threshold, the comparator output alerts the digital control 106 that an acceptable INL had been exceeded. The part can then be rejected.

In a more detailed description of operation, DAC output 206 and ramp generation output 306 are provided to amplifier 116. The output of amplifier 116 provides an automatic gain control signal 126 which is forwarded to an AGC input of the ramp control circuit 102. The ramp generation circuit receives a voltage input via voltage source 120 and provides a ramping function that is initiated by digital control circuit 106. When the ramp is initiated, the ramp generation circuit produces a current that is supplied to the capacitor 122 to generate a voltage ramp 306. The AGC control signal 126 is used to train the slope of the ramped voltage output 306 of ramp generation circuit 102. The ramp generation output 306 is also provided to sample and hold circuit 108 to generate a sample of the ramp generation signal 406.

First comparator 110 receives DAC output voltage 206 at a negative input port and receives ramp generating output 306 at a positive input port. Meanwhile, second comparator 112 receives DAC output voltage 206 at its respective positive input port and receives ramp generation output 306 at its respective negative input port. Third comparator 114 receives DAC output voltage 206 at its respective negative input port and receives the delayed ramp generation output 406 at its respective positive input port. Comparator 114 compares the maximum voltage of DAC output 104 to the maximum voltage of ramp output 306 for stage 2 of the training of ramp generation circuit 102. The output of comparator 114 is fed back to digital control circuit 106 to provide an indication that the maximum voltages of 104 and 306 are substantially equal. The outputs of the two comparators 110, 112 are fed back to digital control circuit 106 to provide an indication of linearity of the DAC output voltage 206 as compared to the ramped voltage 306 over time.

Figure 3:
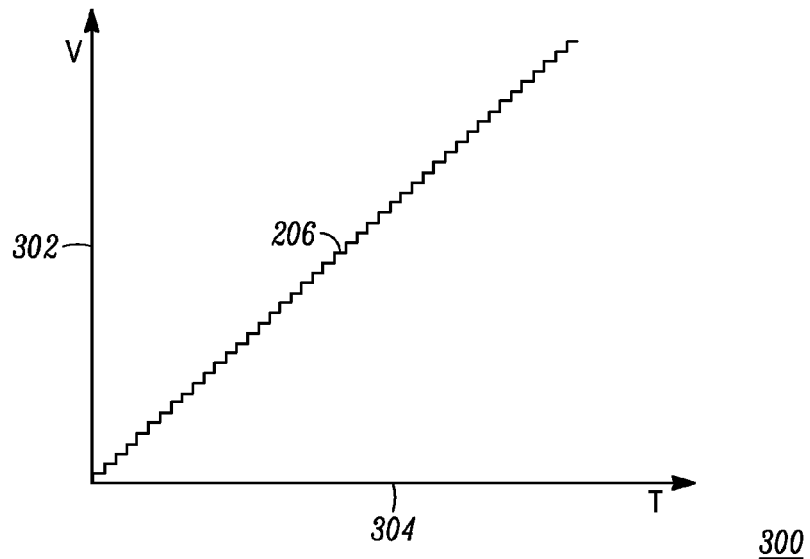
FIG. 3 is a graph of ideal DAC output voltage vs. time for use in training the self-testing circuit in accordance with various embodiments of the invention.
Figure 4:
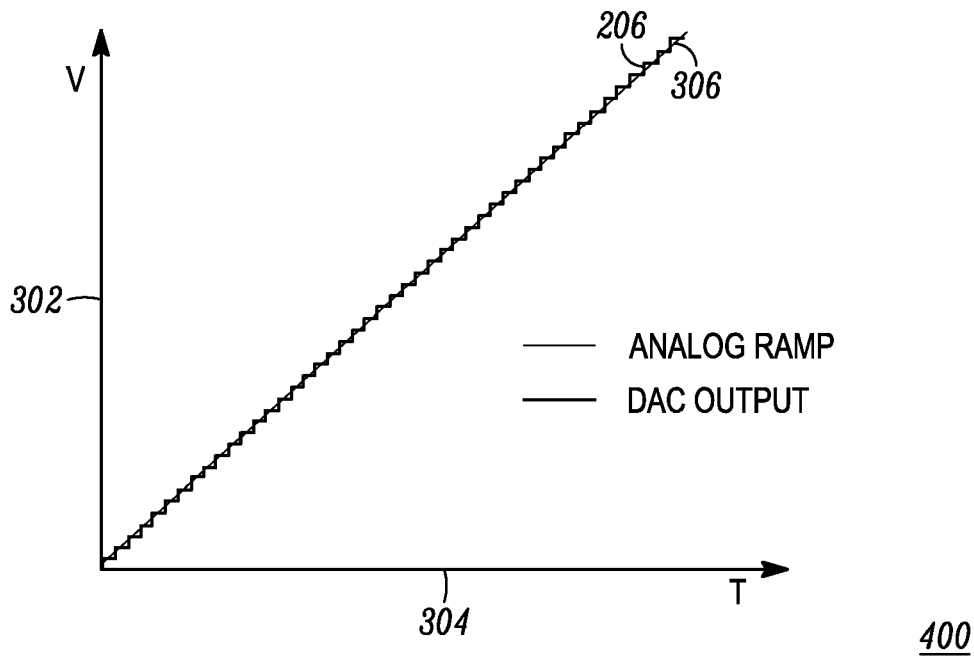
FIG. 4 is a graph comparing an analog ramp output and DAC output for an optimally trained self-testing integrated DAC circuit in accordance with various embodiments of the invention.

An ideal case of DAC output voltage (V) vs. time (T) is shown in FIG. 3. The graph 300 of FIG. 3 shows voltage 302 vs. time 304 generating an ideal stepped response for DAC output voltage 206. Referring now to FIG. 4, there is shown a graph 400 showing output voltage 302 vs. time 304 along with the ideal stepped DAC response 206 and the analog ramp output signal 306, the ramp output voltage being trained such that the starting voltage and slope of the ramp 306 are substantially equivalent to the starting voltage and slope of the DAC output 206.

The ramp output 306 is trained in two stages. The first stage of training utilizes the AGC function of ramp generation circuit 102 that detects a difference in slope between the analog ramp 306 and DAC output voltage 206. The current that is generated in ramp generation circuit 102 and applied to capacitor 122 is adjusted in proportion to the detected difference in the slope so that the analog ramp slope 306 will match that of the DAC output 206. The digital control circuit 106 enables the AGC function of the ramp generation circuit 102 for a predetermined portion of the ramp to allow the ramp slope 306 to adjust and then the AGC is disabled and the ramp slope is locked at the adjusted value.

The second stage used to train the analog ramp slope 306 utilizes the sample and hold (SAH) circuit 108 to sample the analog ramp voltage 306 at the exact time that the digital counter of digital control 106 reaches the last step in the DAC. To obtain an accurate INL measurement, the analog ramp should reach the same voltage as the last step of the DAC at the instant the DAC reaches its last step. At this last step, a sampled output 406 of the SAH 108, controlled via digital control line 146, is compared to the DAC maximum value via comparator 114. If the compared values are not substantially equal indicating that the slopes of the analog ramp 306 and DAC ramp 206 are not equal, the current applied to capacitor 122 by ramp generation circuit 102 is adjusted by adding or subtracting a low level current from the previous current applied to capacitor 122. This adjustment is repeated until the slope is adjusted for the proper final value of the analog ramp.

Once the analog ramp is adequately trained, the self test of the DAC can begin. Analog ramp 306 and DAC output ramp 206 are initiated by digital control circuit 106.

While FIG. 4 shows an ideal case for the DAC output, the steps on an actual DAC will vary due to part defects and also due to process variations causing component mismatch from part to part. If these imperfections cause the DAC response to deviate from the linear case by more than a predetermined deviation threshold (as indicated by the comparator outputs), then the part is rejected by the digital control circuit 106. An example of a response of a DAC with imperfections is shown in FIG. 5.

Figure 5:
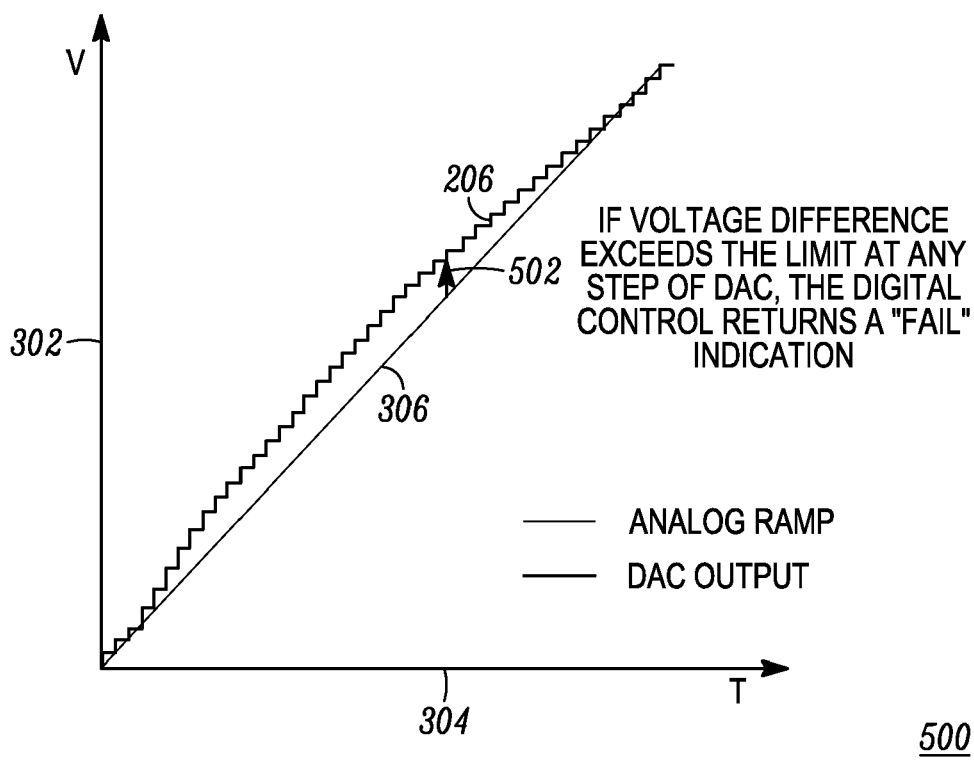
FIG. 5 is a graph comparing analog ramp output and DAC output for a DAC with mismatch causing output error indicating a rejected DAC in accordance with various embodiments of the invention.

FIG. 5 is a graph showing voltage 302 vs. time 304 comparing analog ramp output 306 and DAC output 206 for a DAC with mismatch causing output error 502. If the voltage difference exceeds a predetermined deviation threshold at any step of the DAC, the digital control circuit 106 generates a word at 118 indicating a "fail" condition.

Figure 6:
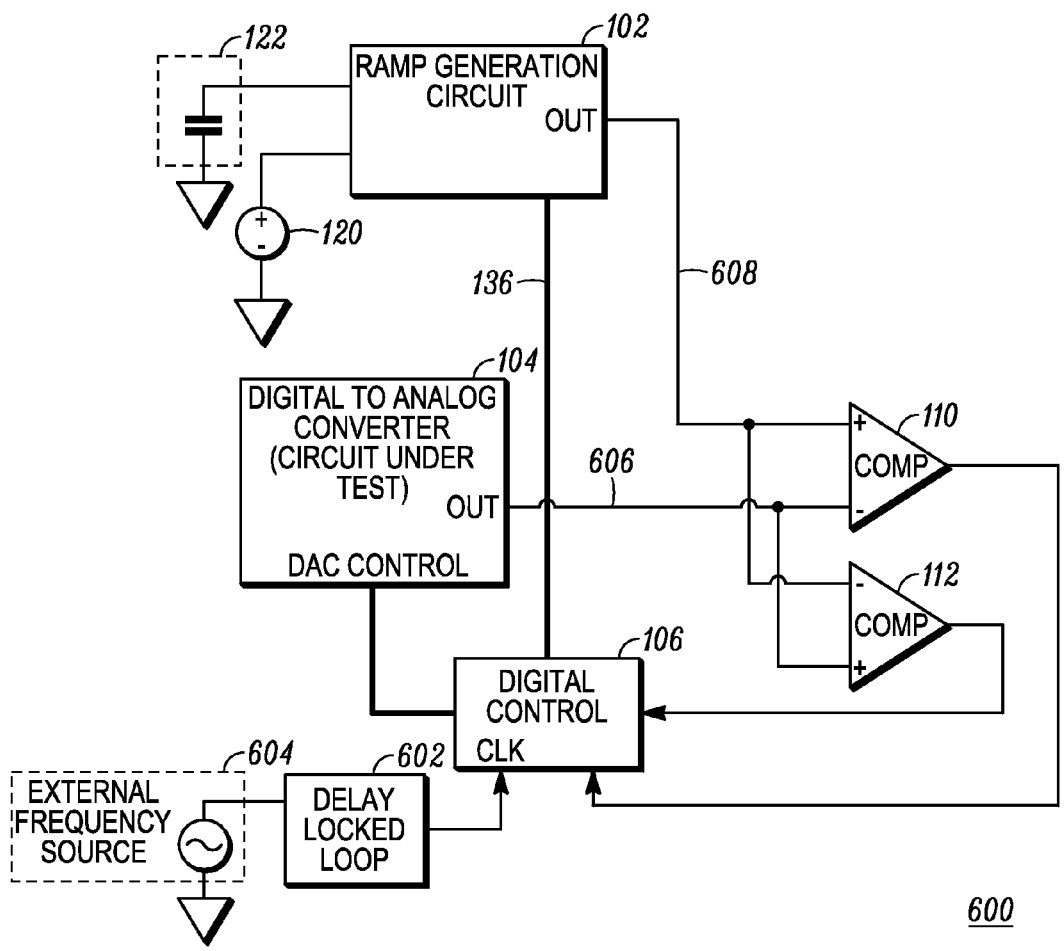
FIG. 6 is a block diagram of an alternative INL portion of the self-testing integrated DAC circuit in accordance with various embodiments of the invention.

Referring now to FIG. 6, a block diagram of a circuit 600 for testing integral non-linearity (INL) of a DAC in accordance with an alternative embodiment of the invention is shown. This alternate embodiment for INL measurement also utilizes the analog ramp circuit 102, digital-to-analog converter 104, digital control circuit 106, comparators 110, 112 voltage source 120 and capacitor 122. In addition, a delay locked loop 602 is coupled to a clock input of the digital control circuit 106. Delay locked loop 602 receives a frequency source via external frequency source 604. Rather than training the analog ramp circuit to match the timing of the DAC range sweep as previously described, this embodiment adjusts the timing of the DAC sweep to match the analog ramp. Because the DAC sweep timing is adjusted to match the DAC ramp 606 with the analog ramp 608, the analog ramp has a fixed slope and therefore no AGC is required.

In operation, the starting voltage for the analog ramp 608 is trained as was the case previously described. The DAC 104 is set for a maximum output voltage. The ramp 102 is started along with a timer under the control of digital control 106. Comparator 110 detects when the analog ramp output voltage reaches the DAC maximum output voltage and sends a signal to digital control 106 to stop the timer. Based on the measured time of the analog ramp, the digital control circuit 106 adjusts the digital control clock frequency by use of the delay locked loop 602. The clock input frequency is adjusted such that the time to sweep the DAC 102 through the full range of values equals the time for the analog ramp to ramp from the DAC minimum voltage value to the DAC maximum voltage value.

The analog ramp 102 and digital counter of digital control 106 are started at the same time. The digital counter controls the DAC's sweep, and as such the analog ramp and DAC sweep are started at the same time. The digital counter is run by the frequency adjusted clock so that the DAC reaches the maximum voltage output at the same time that the analog ramp reaches substantially the same maximum voltage (i.e. within a predetermined acceptable voltage range). Comparators 110, 112 test for variation in the DAC output and determine whether or not the DAC meets predetermined INL thresholds limits.

Figure 7:
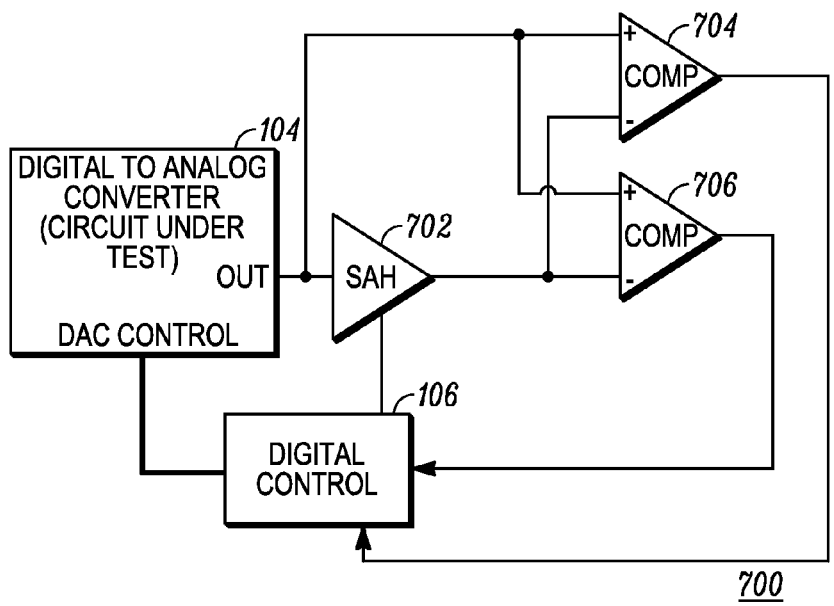
FIG. 7 is a block diagram of a DNL portion of the self-testing integrated DAC circuit of FIG. 1 in accordance with various embodiments of the invention.

In accordance with the various embodiments, differential non linearity (DNL) is also provided as part of the self-testing DAC integrated circuit. FIG. 7 is a block diagram of a self testing DAC integrated circuit in accordance with a DNL embodiment. DAC self testing circuit 700 comprises DAC 104, digital control 106 and sample and hold circuit 702 in conjunction with comparators 704, 706. As mentioned previously while two sample and hold circuits 108 and 702, (one for each circuit) have been shown to facilitate the description, a single SAH could also be switched back and forth between the two outputs. Note that the ramp generation circuit is not used to test DNL.

The DAC output voltage is sampled and held by SAH 702. As the DAC 104 is stepped through the DAC range by digital controller 106, the output of a given step is applied to the positive inputs of the comparators 704, 706 while the voltage from the previous step is applied to the negative inputs of the comparators. Comparator 706 is trained to detect a predetermined minimum step difference for the DAC 104, while comparator 704, is trained to detect a maximum step difference. Should any given DAC step fail to exceed the minimum value, then comparator 706 will signal to the digital control circuit 106 that the DAC does not meet requirements. The part can thus be rejected. Likewise, if any step should exceed the maximum predetermined voltage step, the comparator 704 will signal the digital control circuit 106 that the DAC 104 does not meet requirements. The part can thus be rejected. If the DAC 104 is stepped through every value without failing to meet the minimum voltage threshold or exceeding the maximum voltage threshold, then the part is considered good. Additionally, if the part meets these criteria, the part will be considered monotonic. Again, monotonicity insures that the output of a DAC always increases or always decreases as the digital input code increases.

Prior to running any of the INL or DNL DAC self-tests, the test circuits themselves may be subjected to some initial verification to be certain that the test circuits are operational. This can be accomplished by including within the design the ability to force the DC voltages onto the DAC output line and analog ramp output line so as to test the comparators and the SAH. The analog ramp can be run through a ramp cycle to verify that it functions properly. The digital control can be tested by scanning prior to running the DAC testing algorithm. Thus, the test circuits provided by the various embodiments provide highly reliable on-chip self-testing capability to the DAC.

Figure 8:
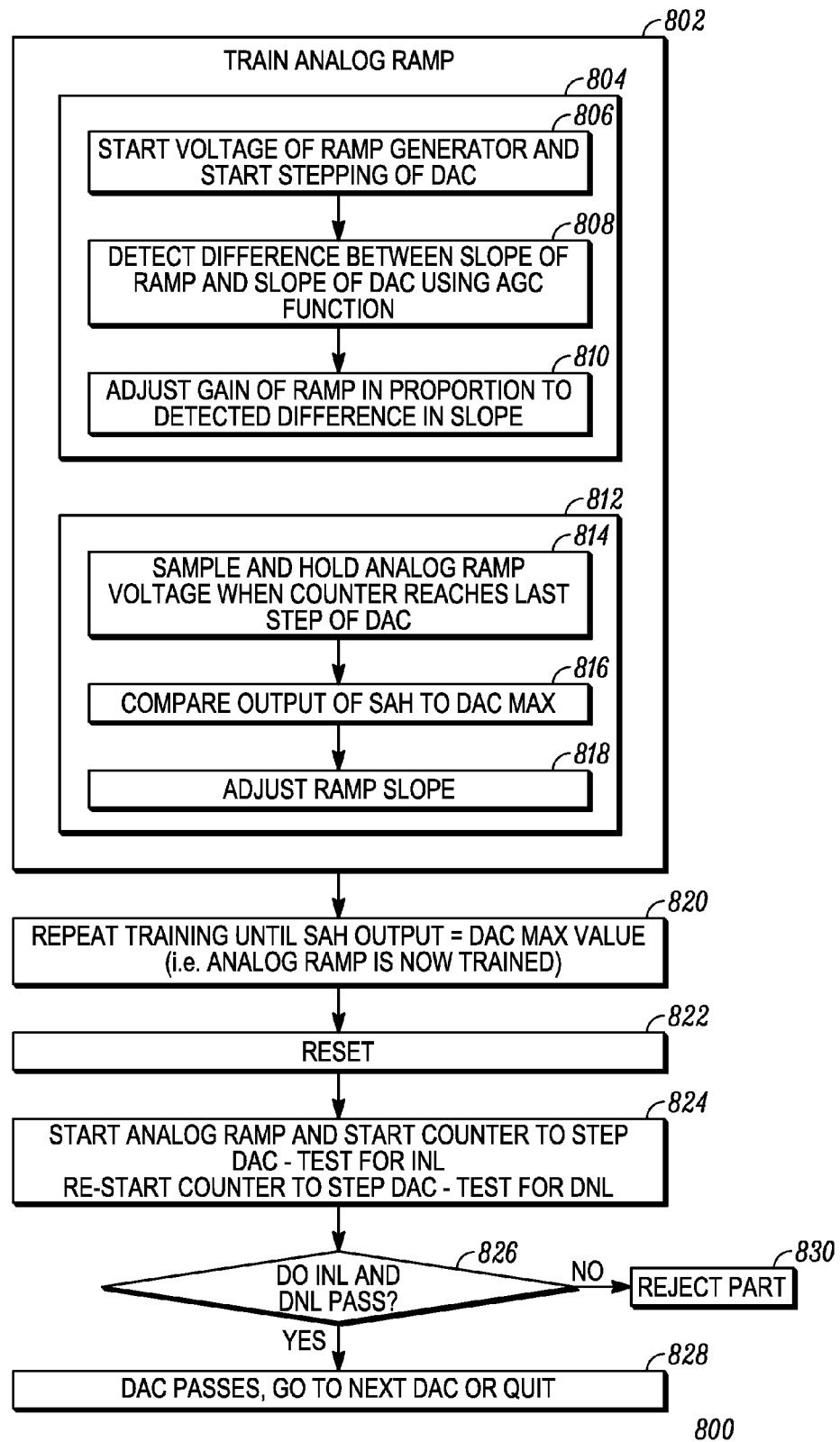
FIG. 8 is method of testing non-linearity in an integrated DAC circuit in accordance with various embodiments of the invention.

FIG. 8 is method of testing non-linearity (INL and DNL) in a DAC in accordance with the various embodiments of the invention. Optional pre-testing of the ramp generator, SAH, comparators and digital control circuit may be taken prior to training the analog ramp. Training the analog ramp 802 encompasses two training stages, a first training stage 804 provides a coarse adjustment to the ramp slope using an AGC function, such as the AGC function of ramp generator 102, and a second training stage 812 which fine tunes the ramp slope using a sample and hold circuit, such as SAH 108.

First training stage 804 starts the voltage ramp generator and starts stepping/sweeping the DAC at 806. Differences between the ramp slope and the slope of the DAC are detected at 808 using the AGC function of the ramp generation circuit 102. The ramp slope is adjusted at 810 in proportion to the detected difference in the slope. This coarse adjustment is made by having the AGC function apply and adjust current to the capacitor 122 until the slope is approximately equal to that of the DAC being swept. The AGC is then locked into the adjusted value.

The second training stage 812 begins at 814 by taking a sample and hold of the analog ramp voltage when the counter of the digital control circuit reaches the last step of the DAC. The output of the sample and hold circuit is compared to the DAC maximum voltage output at 816 and the ramp slope is adjusted at 818 to compensate for differences between the SAH output and the DAC maximum voltage output. The slope adjustment at 818 is a fine tune adjustment which can be achieved by adding or subtracting a small amount of current to the capacitor 122.

The analog ramp training 802 is repeated until the SAH output substantially equals the DAC maximum output value thereby providing a trained analog ramp at 820. Once the analog ramp is trained, the counter for the DAC is reset and the analog ramp circuit is reset at 822. Next at 824, the analog ramp is started at substantially the same time as the counter to step the DAC. A test for INL is made and a test for DNL is also made. The INL and DNL can be tested at the same time or can be measured at different times. Moving to 826, the INL and DNL are compared to predetermined INL and DNL thresholds. If either test fails then the part is rejected at 830. If the INL and DNL are acceptable then the DAC passes and the next DAC can be tested or the testing can quit at 828.

Accordingly, there has been provided a circuit and method for built-in self testing of a DAC integrated circuit. The combination of ramp generator and other low cost components (comparators, counters, etc.) along with a method to train the ramp allows linearity defects in the DAC to be detected without the use of complex test architecture. Generating a ramp, as provided by the various embodiments, is much more area/space efficient and allows more thorough testing of the DAC.

The coarse tuning of the ramp through the AGC function and the fine tuning of the ramp through the sample and hold circuit provide for an improved training of the ramp. The AGC function can be eliminated if an external frequency source and delay locked loop are used. While the DAC output has been described in terms of a voltage output, the various teachings of the invention also apply to a DAC current output. Also, a single sample and hold circuit switched back and forth can be used rather than two. Additionally, the capacitor used for controlling current applications to the ramp generator circuit can be internal or external to the chip, depending on integrated circuit space constraints.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions.

The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

I claim:

1. An on-chip test circuit for a digital-to-analog converter (DAC), comprising:
    a ramp generation circuit for generating an analog ramp over time, the ramp generation circuit and DAC being swept from a same starting time;
    one or more sample and hold circuits for capturing output samples from the DAC and for capturing output samples from the ramp generation circuit; and
    a digital control circuit for indicating to the DAC whether a predetermined linearity threshold has been exceeded at any instant over the swept time.

2. The on-chip test circuit of claim 1, wherein the predetermined linearity threshold comprises at least one of: integral non-linearity (INL) and differential non-linearity (DNL) thresholds.

3. The on-chip DAC test circuit of claim 1, wherein the analog ramp timing is trained to match DAC sweep timing.

4. The on-chip DAC test circuit of claim 1, wherein the timing of the DAC sweep is adjusted to match the analog ramp timing.

5. The on-chip DAC test circuit of claim 1, wherein the DAC generates a DAC voltage output and the ramp generator circuit generates a ramp voltage output, and wherein the DAC voltage output and the ramp voltage output are compared to determine whether the predetermined linearity threshold has been exceeded.

6. The on-chip DAC test circuit of claim 5, further comprising:
a plurality of comparators for receiving the ramped voltage output and the DAC voltage output, the plurality of comparators generating comparator output signals used by the digital control circuit to determine whether the predetermined linearity threshold has been exceeded.

7. The on-chip DAC test circuit of claim 1, further comprising:
a clock input frequency adjusted so that the time to sweep the DAC through a full range of values equals the time for the analog ramp circuit to ramp from a DAC minimum value to a DAC maximum value.

8. The on-chip DAC test circuit of claim 1, further comprising:
an amplifier for generating an automatic gain control (AGC) signal, the analog ramp being trained by utilizing the AGC signal to detect a difference in slope between the analog ramp and DAC output rate of change, a gain of the ramp generation circuit being adjusted in proportion to the detected difference in the slope so that the analog ramp slope substantially matches that of the DAC output.

9. The on-chip DAC test circuit of claim 8, further comprising:
a sample and hold (SAH) circuit to sample the analog ramp output at the exact time as the DAC output's last step.

10. The on-chip DAC test circuit of claim 1, wherein the DAC generates a DAC voltage output and the ramp generator circuit generates a ramp voltage output.

11. The on-chip DAC test circuit of claim 1, wherein the DAC generates a current output and the ramp generator circuit generates a current output.

12. A method for detecting linear defects in a digital-to-analog converter (DAC), comprising:
generating an analog ramp for comparison to a DAC output swept over time;
training the analog ramp and the DAC output to start at the same start time and voltage with the same slope;
resetting the DAC;
beginning the ramp signal and a new sweep of the DAC at the same time; and
comparing the new stepped DAC output over time to the trained ramped signal to detect linear defects in the DAC output.

13. The method of claim 12, wherein the same starting time is controlled by one of:
training the analog ramp to match the timing of the DAC range sweep; and
adjusting the timing of the DAC sweep to match the analog ramp timing.

14. The method of claim 13, further comprising one of:
rejecting the DAC when the step of comparing results in exceeding a predetermined INL threshold;
rejecting the DAC when the step of comparing results in exceeding a predetermined maximum DNL threshold; and
rejecting the DAC when the step of comparing results in not meeting a predetermined minimum DNL threshold.

15. A self-testing digital-to-analog converter (DAC) integrated circuit, comprising:
an analog ramp generation circuit generating a ramp output;
a DAC generating a stepped DAC output; and
a digital control circuit controlling the analog ramp generation circuit and the DAC to generate adjustable sloped outputs for testing integral non-linearity (INL) and differential non-linearity (DNL) of the DAC.

16. The self testing DAC integrated circuit of claim 15, wherein the stepped DAC output is one of: a voltage output, a current output.

17. The self-testing DAC integrated circuit of claim 15, further comprising:
an external frequency source generating a frequency signal;
a delay locked loop receiving the frequency signal and providing a delay locked loop output; and
the digital control circuit receiving the delay locked loop output as a clock signal, the clock signal being used by the digital control circuit to adjust a start and end time for the DAC to match a start time and end time of the analog ramp generation circuit, the ramp output having a fixed slope.

18. The self-testing DAC integrated circuit of claim 15, wherein the analog ramp generation circuit is trained in two stages comprising:
a first training stage providing a coarse adjustment to the ramp output using an AGC function; and
a second training stage providing fine tuning of the ramp output using a sample and hold circuit.

19. The self-testing DAC integrated circuit of claim 18, wherein in the first training stage the ramp generator circuit and DAC are started and swept over time such that differences between the ramp output and a slope of the stepped DAC are detected using the AGC function of the ramp generation circuit; and
the ramp output being adjusted in proportion to the detected differences.

20. The self-testing DAC integrated circuit of claim 19, wherein in the second training stage the sample and hold circuit takes a sample of the ramp output when the DAC reaches its maximum step output;
the output of the sample and hold circuit being compared to the DAC maximum step output, and the ramp output being adjusted to compensate for differences between the SAH output and the DAC maximum output.

21. The self-testing DAC integrated circuit of claim 15, wherein the ramp generation circuit is trained to provide a trained ramp output having a slope that substantially matches the stepped DAC output; and
the digital control circuit uses the trained ramp output to compare to a subsequent stepped DAC output to test for integral non-linearity (INL) defects, the digital control circuit using the sample and hold circuit output to compare a previous DAC step output to a present DAC step output to test for differential non-linearity (DNL) defects in the DAC.

* * * * *